US006218763B1

(12) United States Patent
Fujimoto et al.

(10) Patent No.: US 6,218,763 B1
(45) Date of Patent: Apr. 17, 2001

(54) SURFACE ACOUSTIC WAVE RESONATOR, FILTER, DUPLEXER AND COMMUNICATION APPARATUS

(75) Inventors: Koji Fujimoto, Otsu; Michio Kadota, Kyoto; Toshimaro Yoneda, Nagaokakyo, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/378,655

(22) Filed: Aug. 20, 1999

(30) Foreign Application Priority Data

Aug. 25, 1998 (JP) .................................................. 10-238820
Apr. 6, 1999 (JP) .................................................. 11-099250

(51) Int. Cl.⁷ ............................ H03H 9/25; H01L 41/047
(52) U.S. Cl. .................................. 310/313 R; 310/313 A; 310/363
(58) Field of Search ........................ 333/193; 310/313 R, 310/313 A, 313 B, 313 D, 340, 348, 363, 364

(56) References Cited

U.S. PATENT DOCUMENTS

| | | | |
|---|---|---|---|
| 5,773,917 | * | 6/1998 | Satoh et al. ............................ 310/364 |
| 5,844,347 | * | 12/1998 | Takayama et al. .............. 310/313 R |
| 5,847,486 | * | 12/1998 | Kadota et al. .................... 310/313 R |
| 5,854,527 | * | 12/1998 | Shimizu et al. ................. 310/313 A |
| 5,905,325 | * | 5/1999 | Naumenko et al. ............. 310/313 R |
| 5,909,156 | * | 6/1999 | Nishihara et al. .................... 333/193 |

FOREIGN PATENT DOCUMENTS

| | | | |
|---|---|---|---|
| 19839247 | * | 3/1999 | (DE) ............................... H03H/9/64 |
| 0 936 734 | * | 8/1999 | (EP) ............................... H03H/9/145 |
| 54-132187 | * | 10/1979 | (JP) ...................................... 310/364 |

* cited by examiner

Primary Examiner—Thomas M. Dougherty
(74) Attorney, Agent, or Firm—Keating & Bennett, LLP

(57) ABSTRACT

A surface acoustic wave resonator includes a piezoelectric substrate and an interdigital transducer disposed thereon. The surface acoustic wave resonator operates using a shear horizontal wave, and the interdigital transducer includes an electrode film made of a metal containing W or Ta as its main component and a thin film made of Al.

13 Claims, 4 Drawing Sheets

SURFACE ACOUSTIC WAVE RESONATOR, FILTER, DUPLEXER AND COMMUNICATION APPARATUS

BACKGROUND OF THE INVENTION

1. Field of the Invention

The present invention relates to a surface acoustic wave resonator using shear horizontal (SH) waves, and more specifically, the present invention relates to a surface acoustic wave resonator in which an interdigital transducer made of a metal containing W or Ta as its main component is provided on a piezoelectric substrate, a filter, a duplexer, and a communication apparatus.

2. Description of the Related Art

Conventionally, a synthesizer local oscillation circuit, which is used for selecting a channel in a portable wireless device having a VHF/UHF band, requires not only miniaturization but also a wider band function for handling the multi-channel system. In addition, even in a surface acoustic wave device used in a voltage-controlled oscillator, which is an essential component of the local oscillator, size reduction and band-widening are strongly demanded.

A surface acoustic wave resonator generating a surface acoustic wave such as a Rayleigh wave is known. In the surface acoustic wave resonator using the Rayleigh wave, however, no matter what type of piezoelectric substrate is used, the electromechanical coupling coefficient is small. Thus, it is difficult to achieve a wider band function.

As a result, a surface acoustic wave resonator using the SH wave has been studied in an attempt to provide a surface acoustic wave resonator having a large electromechanical coupling coefficient so as to achieve the wider band function. A Love wave which is known to be a type of the SH wave is generated by forming an interdigital transducer on the piezoelectric substrate, wherein the interdigital transducer is made of a metal film which has slower sound velocity and a higher density than that of a piezoelectric substrate.

Such a surface acoustic wave resonator, conventionally has a structure in which an interdigital transducer made of Au is formed on a LiNbO$_3$ substrate of Y-cut X-propagation.

However, since the surface acoustic wave resonator, which uses Au in the interdigital transducer, requires excessive material cost, the surface acoustic wave resonator is very expensive.

Thus, a surface acoustic wave resonator in which a metal containing W or Ta, which is cheaper than Au, as its main component, is used in an interdigital transducer, has been examined.

In general, a surface acoustic wave resonator and a surface wave filter are contained in a ceramic package, and have a structure in which the external terminal of the ceramic package and a bonding pad of an interdigital transducer are connected via wire bonding.

However, when a surface acoustic wave resonator using a metal containing W or Ta as its main component of the interdigital transducer is formed, since the metal having the main component of W or Ta resists being bonded to Au, ball bonding cannot be performed with respect to a wire made of Au or alloys of Au.

Additionally, in order to excite the Love wave, the thickness of an electrode film of the interdigital transducer made of a metal having the main component of W or Ta is set to about 0.02 μm to about 1.0 μm.

When the electrode film of the interdigital transducer made of a metal having the main component of W or Ta has a thickness which is greater than this range, there is a problem which occurs when forming an electrode pattern of the interdigital transducer via reactive ion etching.

In other words, when the electrode pattern is formed of a metal having a main component of W or Ta, a resist is removed before completion of etching of the electrode pattern and thereby, the electrode patterns are damaged.

SUMMARY OF THE INVENTION

In order to overcome the problems described above, preferred embodiments of the present invention provide a surface acoustic wave resonator and a method of making thereof, in which, when a metal having a main component of W or Ta is used to form an electrode, ball bonding to a wire made of Au or alloys of Au is performed. The resonator is arranged to use an SH wave and to have an electrode structure which does not influence an electrode pattern when the electrode pattern is formed by reactive ion etching.

According to one preferred embodiment of the present invention, a surface acoustic wave resonator includes a piezoelectric substrate and an interdigital transducer provided thereon. The surface acoustic wave resonator is adapted to operate using a shear horizontal wave, and the interdigital transducer includes an electrode film made of a metal containing W or Ta as its main component and an Al thin film provided on the electrode film.

According to preferred embodiments of the present invention, since the Al thin-film is formed on the electrode film made of a metal containing Ta or W as its main component, bonding of a wire made of Au or alloys of Au is possible. Additionally, in the case of performing reactive ion etching, it is possible to prevent damage to the electrode pattern itself and to avoid etching of the electrode of a necessary part of the electrode pattern.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
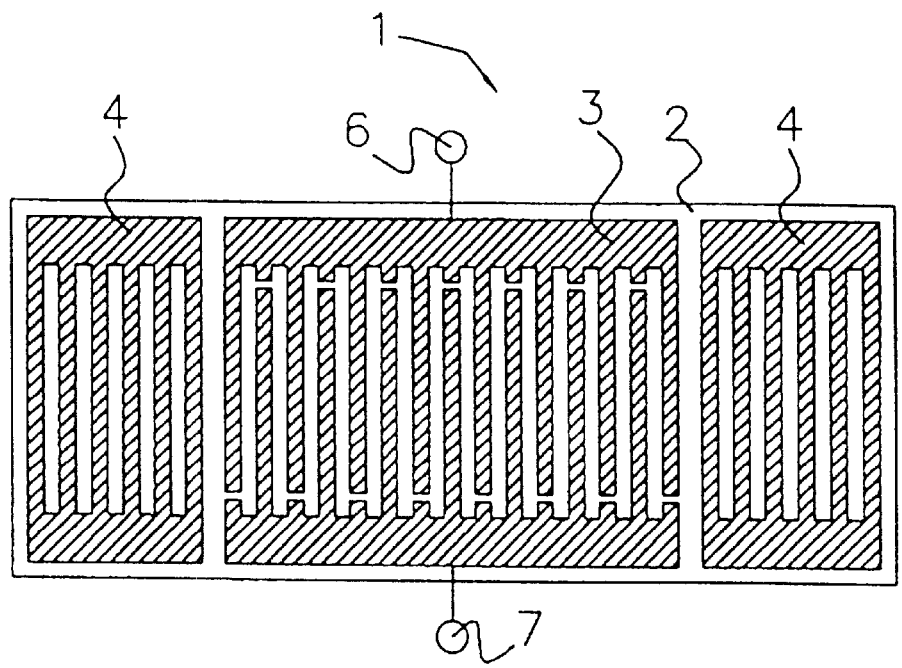
FIG. 1 is a plan view of a surface acoustic wave resonator according to a first preferred embodiment of the present invention.
Figure 2:
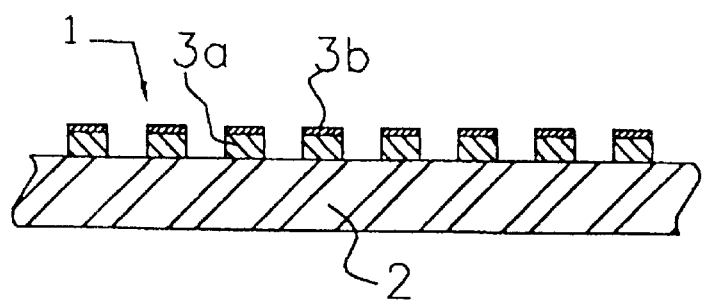
FIG. 2 is a partially enlarged sectional view in an area for forming an interdigital transducer of the first preferred embodiment of the present invention.

FIG. 1 is a plan view of a surface acoustic wave resonator illustrating a first preferred embodiment of the present invention, and FIG. 2 is a partially-enlarged sectional view of an area used for forming an interdigital transducer.

As shown in FIG. 1, in a surface acoustic wave resonator 1 of a preferred embodiment of the present invention, an interdigital transducer 3 including a pair of comb-shaped electrodes is formed on a main surface of a piezoelectric substrate 2, and reflectors 4 are provided on both sides of the interdigital transducer 3.

Furthermore, I/O terminals 6 and 7 are connected to the interdigital transducer 3.

The interdigital transducer 3 and reflectors 4, as shown in FIG. 2, define a double-layer structure. The interdigital transducer 3 comprises electrode film 3a made of a metal having a main component of Ta and an Al thin-film 3b provided on the electrode film 3a. A thickness of the electrode film 3a is preferably about 0.02 μm to about 1.0 μm, whereas the thickness of the Al thin-film 3b is about 0.01 μm to about 0.1 μm, which is preferably thinner than the film thickness of the electrode film 3a. The reason for this is that if the Al thin-film is thicker, the characteristics of the interdigital transducer changes.

The electrode film 3a may be made of a metal having a main component of W, and the piezoelectric substrate 2 may be a crystal substrate having Euler angles (0°, about 125° through about 132°, 90°). Selection of a base material used for the piezoelectric substrate 2 depends on the characteristics desired. When an excellent electromechanical coupling coefficient is necessary, the $LiNbO_3$ of a rotated Y-cut X-propagation and the $LiTaO_3$ of a rotated Y-cut X-propagation are selected, whereas when excellent frequency-temperature characteristics are necessary, the crystal substrate of Euler angles (0°, about 125° through about 132°, 90°) is selected.

Furthermore, it is not necessary to form the Al thin-film 3b directly on the electrode film 3a, and for example, a bonding layer or a buffer layer made of Ti, Ni, or other suitable material, may be disposed between the Al thin-film 3b and the electrode film 3a.

Next, a description will be provided of a method of manufacturing a preferred embodiment of the present invention.

First, an $LiNbO_3$ substrate of Y-cut X-propagation is provided. An electrode film made of a metal having a main component of Ta or an electrode film made of a metal having a main component of W is formed by sputtering or other suitable process. Then, an Al thin-film is formed on the electrode film and is formed of a metal having a main component of Ta or the Al thin-film is formed on the electrode film and is made of a metal having a main component of W via sputtering or other suitable process. Next, a resist film, which is made into a specified pattern, is formed to perform reactive ion etching.

Reactive ion etching is a method in which a thin film reacts with a gas to be etched, in which $CF_4$ is mainly used as the gas with respect to the metal containing W or Ta as its main component, and $Cl_2+BCl_3$ is mainly used with respect to Al. Since an ordinarily used resist film slightly reacts with $CF_4$, the resist film sometimes is undesirably removed. In contrast, since the Al thin-film formed on the electrode film made of a metal containing Ta as its main component or formed on the electrode film made of a metal containing W as its main component does not react with $CF_4$, as an alternative to the resist, it prevents undesired etching of a necessary part of the electrode film, which is made of a metal containing Ta as its main component or a metal containing W as its main component.

Accordingly, in this preferred embodiment, since the Al thin-film is formed on the electrode made of a metal containing Ta or W as its main component, bonding of a wire made of Au or alloys of Au is possible. In addition, as described above, in the case of performing reactive ion etching, it is possible to prevent the electrode pattern itself from being damaged and to avoid etching of a necessary part of the electrode.

Figure 3:
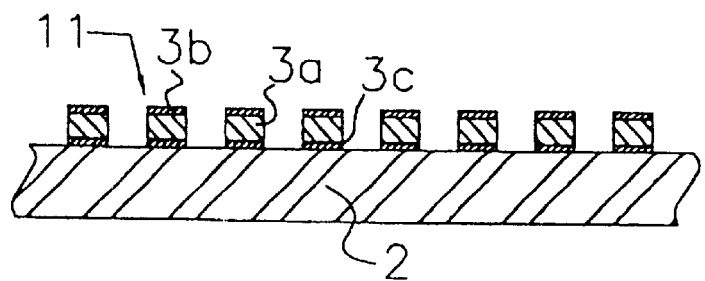
FIG. 3 is a partially enlarged sectional view in an area for forming an interdigital transducer according to a modification of the first preferred embodiment of the present invention.

Referring to FIG. 3, a description will be provided for a modification of the first preferred embodiment of the present invention. FIG. 3 is a partially enlarged sectional view of an area for forming an interdigital transducer of the modification of to the first preferred embodiment of the present invention.

In a surface acoustic wave resonator 11, the interdigital transducer and the reflector has a triple layer structure, as shown in FIG. 3, in which an Al thin-film 3c, an electrode film 3a made of a metal containing Ta as its main component, and an Al thin-film 3b are formed on the piezoelectric substrate 2 made of a $LiNbO_3$ of Y-cut X-propagation.

Such an arrangement, in which the Al thin-film 3c having smaller relative resistance than that of the electrode film 3a is formed between the piezoelectric substrate 2 and the electrode film 3a, permits resonance impedance to be smaller so that satisfactory impedance characteristics are achieved.

As in the case of the preferred embodiment shown in FIG. 1, the Al thin-film 3b does not have to be formed directly on the electrode film 3a. For instance, a bonding layer or a buffer layer made of Ti, Ni, or other suitable material, may be disposed between the Al thin-film 3b and the electrode film 3a. In addition, the Al thin-film 3c does not need to be formed directly under the electrode film 3a. For instance, a bonding layer or a buffer layer made of Ti, Ni, or other suitable material, may be disposed between the Al thin-film 3c and the electrode film 3a.

Figure 4:
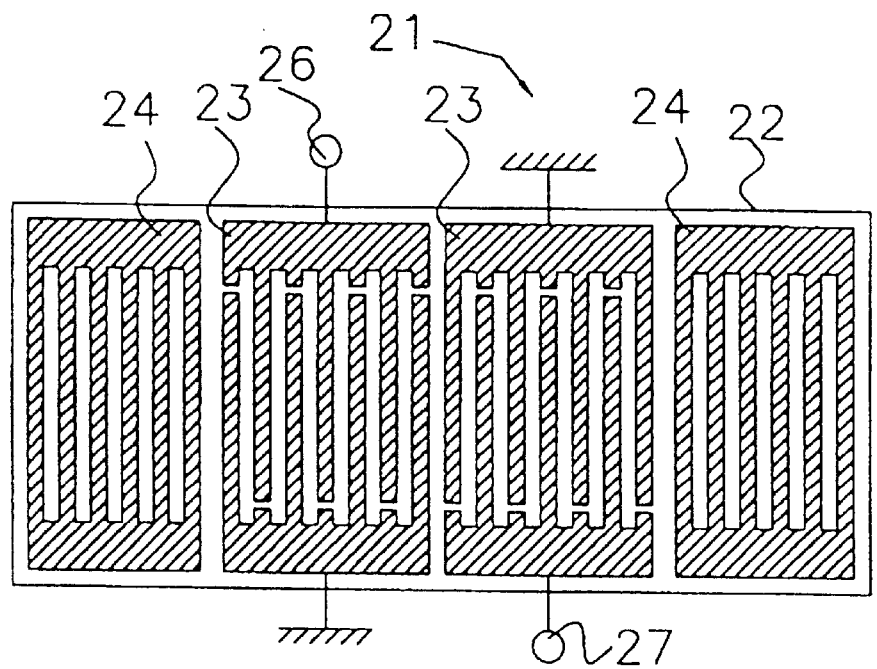
FIG. 4 is a plan view of a filter according to a second preferred embodiment of the present invention.

Now, a description will be provided of a second preferred embodiment of the present invention. FIG. 4 is a plan view of a filter showing a second preferred embodiment of the present invention.

As shown in FIG. 4, in a filter 21 of this preferred embodiment, interdigital transducers 23 including two pairs of comb-shaped electrodes are disposed on a main surface of a piezoelectric substrate 22, whereas reflectors 24 are arranged on both sides of the interdigital transducer 23. One of the interdigital transducers 23 is connected to an I/O terminal 26, the other interdigital transducer 23 is connected to an I/O terminal 27. As shown in FIG. 4, the two interdigital transducers 23 are disposed substantially parallel to a direction of surface-wave propagation so as to define a vertical-coupling type of resonator filter.

Furthermore, the interdigital transducer 23 and the reflector 24 define a double layer structure as in the case of the first preferred embodiment shown in FIG. 2, in which an electrode made of a metal containing Ta as its main component and an Al thin-film are formed on a piezoelectric substrate made of a $LiNbO_3$ of Y-cut X-propagation.

This arrangement allows the same advantages as those achieved in the first preferred embodiment to be obtained, and can provide a filter having wider band characteristics.

Figure 5:
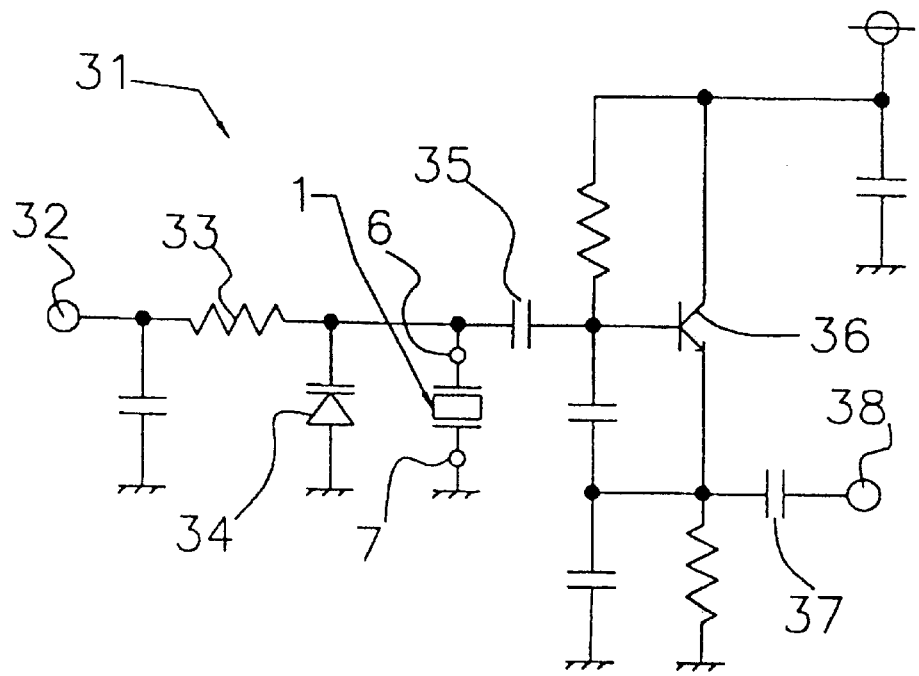
FIG. 5 is a block diagram of an oscillator according to a third preferred embodiment of the present invention.

Next, a description will be provided concerning a third preferred embodiment of the present invention. FIG. 5 is an electric circuit diagram of an oscillator according to the third preferred embodiment of the present invention.

As shown in FIG. 5, in an oscillator 31, the surface acoustic wave resonator 1 shown in the first preferred embodiment is used as a resonance device. A control voltage for controlling oscillation frequencies is applied to a control-voltage input terminal 32, and the input terminal 32 is connected to the I/O terminal 6 of the surface acoustic wave resonator 1 via a resistor 33, whereas the I/O terminal 7 of the surface acoustic wave resonator 1 is grounded to a reference potential. Since the capacity component of the surface acoustic wave resonator 1 is small, a varicap 34 is connected in parallel. Resonance output of the surface acoustic wave resonator 1 is input to a base of a transistor 36 through a capacitor 35. The input current of transistor 36 is output from an output terminal 38 through a capacitor 37 by the output from a resonance circuit including the surface acoustic wave resonator 1.

Since the surface acoustic wave resonator 1 used in this preferred embodiment has a large electromechanical coupling coefficient as described in the first preferred embodiment, significant widening the band of an oscillator using this resonator is achieved.

Figure 6:
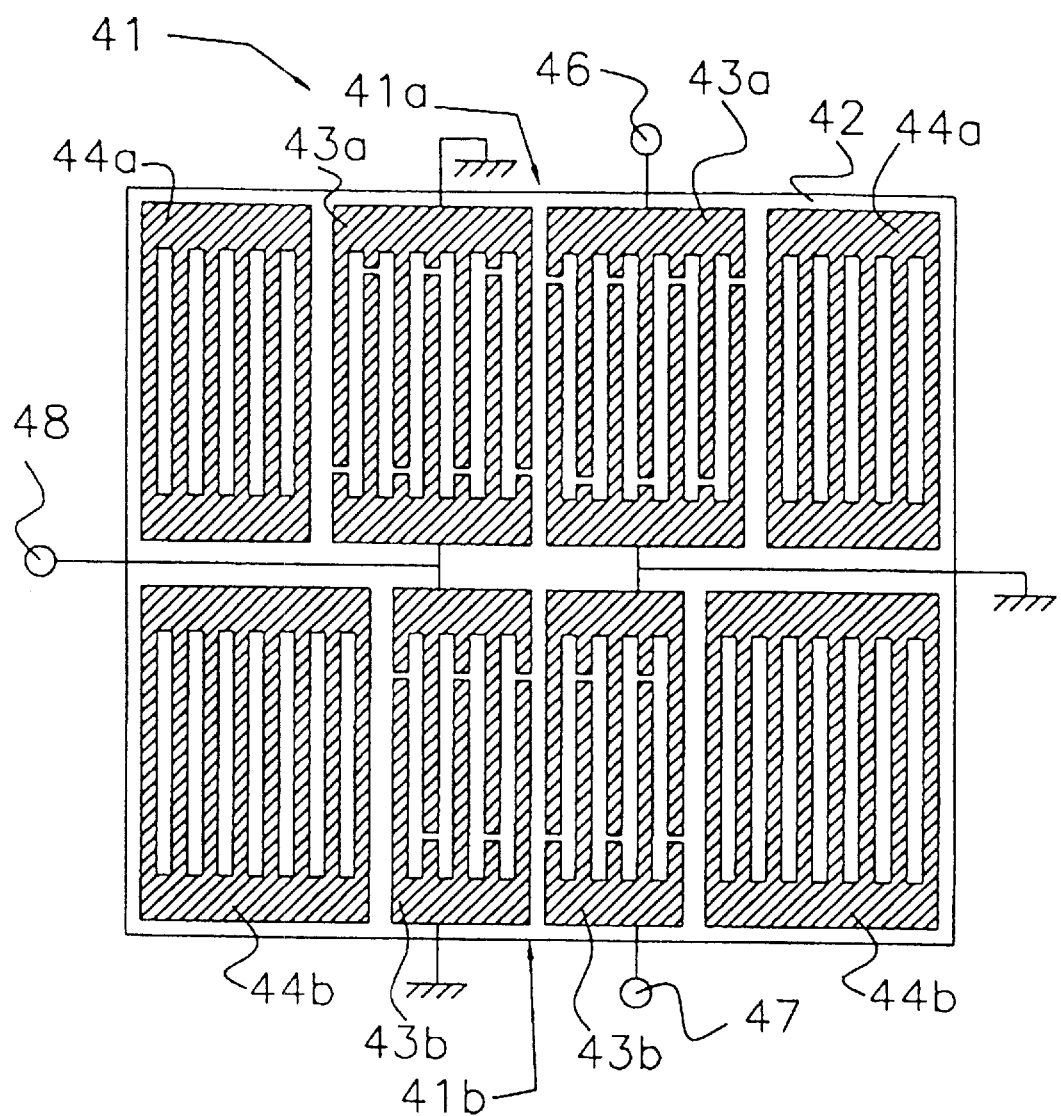
FIG. 6 is a plan view of a duplexer according to a fourth preferred embodiment of the present invention.

A description will be provided of a fourth preferred embodiment of the present invention. FIG. 6 is a plan view of a duplexer showing the fourth preferred embodiment of the present invention.

As shown in FIG. 6, a duplexer 41 includes a first filter 41a and a second filter 41b.

Interdigital transducers 43a and 43b including four pairs of comb-shaped electrodes are provided on one main surface of a piezoelectric substrate 42, and reflectors 44a and 44b are provided on both sides of the interdigital transducers 43a and 43b. An I/O terminal 46 is connected to one of the interdigital transducers 43a. An I/O terminal 47 is connected to one of the interdigital transducers 43b. A common terminal 48 is connected for common use to the other interdigital transducers 43a and the other interdigital transducer 43b. This arrangement permits the interdigital transducers 43a and the reflectors 44a to define a first filter 41a, and permits interdigital transducers 43b and the reflectors 44b to define a second filter 41b.

The interdigital transducers 43a and the interdigital transducers 43b have different configurations to achieve different characteristics. The configuration in this case indicates a structure which changes the characteristics of the interdigital transducers such as an electrode-finger pitch, an electrode-finger width, a number of pairs of interdigital electrodes, a crossing width of interdigital electrodes, weighting of interdigital electrodes, and so forth. This differentiates frequencies of the first filter 41a from those of the second filter 41b.

The interdigital transducers 43a and 43b and the reflectors 44a and 44b define a double layer structure, as in the case of the first preferred embodiment shown in FIG. 2. An electrode made of a metal containing Ta as its main component and an Al thin-film are formed on the piezoelectric substrate made of a LiNbO$_3$ of Y-cut X propagation.

Such an arrangement permits the same advantages as those achieved in the first preferred embodiment to be obtained so that a duplexer having wider-band characteristics can be obtained. The first filter and the second filter can be used both for transmission or both for reception. Alternatively, one of the filters may be used for transmission and the other one may be used for reception.

Figure 7:
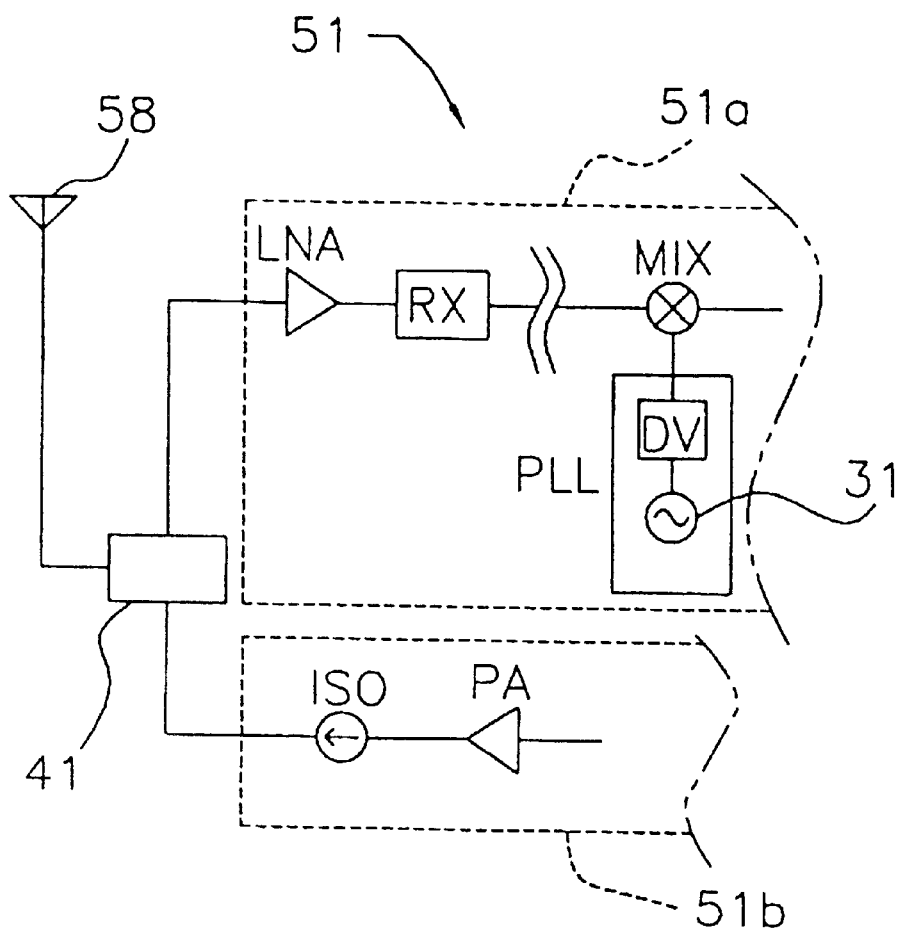
FIG. 7 is a block diagram of a communication apparatus according to a fifth preferred embodiment of the present invention.

A description will be provided of a fifth preferred embodiment of the present invention. FIG. 7 is a schematic block diagram of a communication apparatus of a preferred embodiment of the present invention.

As shown in FIG. 7, a communication apparatus 51 according to this preferred embodiment includes a duplexer 41 having a transmitting filter and a receiving filter, an antenna 58 which is connected to an antenna connection unit of the duplexer 41, a transmission circuit 51a which is connected to an I/O unit of the transmitting filter side of the duplexer 41, and a reception circuit 51b which is connected to an I/O unit of the receiving filter side of the duplexer.

The transmission circuit 51a has a power amplifier (PA). A transmission signal is amplified by the power amplifier and sent to an isolator (ISO). After that, it is transmitted from the antenna 58 through the transmitting filter of the duplexer 41. Receiving signals are sent to the reception circuit 51b from the antenna 58 through the receiving filter of the duplexer 41, and passes through a low noise amplifier (LNA), a receiving filter (RX), etc., in the reception circuit 51b. After that, a mixer (MIX) mixes local signals coming from a local oscillator formed by a phase-locked loop (PLL) composed of an oscillator 31 and a divider (DV) so as to output intermediate frequencies from the mixer.

Such an arrangement permits the same advantages as those achieved in the first preferred embodiment to be obtained so that a communication apparatus having wider-band characteristics is obtained.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave resonator comprising:
   a piezoelectric substrate; and
   an interdigital transducer disposed on the piezoelectric substrate; wherein
   the surface acoustic wave resonator is arranged to generate a shear horizontal wave, and the interdigital transducer includes an electrode film made of a metal containing W or Ta as its main component and a first AL thin film provided on the electrode film, the first AL thin film being thinner than the electrode film.

2. The surface acoustic wave resonator according to claim 1, wherein the interdigital transducer further includes a second Al thin film between the piezoelectric substrate and the electrode film.

3. The surface acoustic wave resonator according to claim 1, wherein the piezoelectric substrate is a rotated Y-cut x-propagation LiNbO$_3$ substrate.

4. The surface acoustic wave resonator according to claim 1, wherein the piezoelectric substrate is a rotated Y-cut x-propagation LiTaO$_3$.

5. The surface acoustic wave resonator according to claim 1, wherein the piezoelectric substrate is a quartz substrate having Euler angles $\phi$, $\gamma$ and $\eta$, wherein $\phi$ is about 0°, $\gamma$ is about 125° to about 132°, and $\eta$ is about 90°.

6. The surface acoustic wave resonator according to claim 1, wherein a thickness of the electrode film is about 0.02 $\mu$m to about 1.0 $\mu$m and a thickness of the first thin film is about 0.01 $\mu$m to about 0.1 $\mu$m.

7. The surface acoustic wave resonator according to claim 1, further comprising one of a bonding layer and a buffer layer made of one of Ti and Ni which is disposed between the first thin film and the electrode film.

8. A surface acoustic wave filter comprising the surface acoustic wave resonator defined by claim 1.

9. An oscillator comprising the surface acoustic wave resonator defined by claim 1.

10. A duplexer comprising the surface acoustic wave filter according to claim 8.

11. A communication apparatus comprising the filter defined by claim 8.

12. A communication apparatus comprising the oscillator defined by claim 9.

13. A communication apparatus comprising the duplexer defined by claim 10.

* * * * *